(12) United States Patent  
Chu et al.

(10) Patent No.: US 7,085,135 B2  
(45) Date of Patent: Aug. 1, 2006

(54) THERMAL DISSIPATION STRUCTURE AND METHOD EMPLOYING SEGMENTED HEAT SINK SURFACE COUPLING TO AN ELECTRONIC COMPONENT

(75) Inventors: Richard C. Chu, Hopewell Junction, NY (US); Michael J. Ellsworth, Jr., Lagrangeville, NY (US); Egidio E. Marotta, College Station, TX (US); Prabjit Singh, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 102 days.

(21) Appl. No.: 10/872,879

(22) Filed: Jun. 21, 2004

(65) Prior Publication Data

US 2005/0281000 A1    Dec. 22, 2005

(51) Int. Cl. *H05K 7/20* (2006.01)
(52) U.S. Cl. .............. 361/704; 361/703; 361/709; 361/710; 257/706; 165/80.3; 165/185
(58) Field of Classification Search .......... 361/704, 361/707, 709–710; 257/706, 707, 712, 718; 165/80.3, 185
See application file for complete search history.

(56) References Cited

U.S. PATENT DOCUMENTS

| | | | |
|---|---|---|---|
| 4,800,956 A | | 1/1989 | Hamburgen ............... 165/185 |
| 5,673,177 A | | 9/1997 | Brodsky et al. ........... 361/704 |
| 5,825,087 A | * | 10/1998 | Iruvanti et al. ............. 257/707 |
| 5,894,882 A | * | 4/1999 | Kikuchi et al. ............ 165/80.3 |
| 6,043,985 A | * | 3/2000 | Azdasht et al. ............. 361/707 |
| 6,134,783 A | | 10/2000 | Bargman et al. ......... 29/890.03 |
| 6,503,626 B1 | * | 1/2003 | Norley et al. ............... 428/408 |
| 6,536,509 B1 | * | 3/2003 | Koidl et al. .................. 165/81 |
| 6,684,501 B1 | | 2/2004 | Ellsworth, Jr. et al. .. 29/890.03 |
| 6,771,502 B1 | * | 8/2004 | Getz et al. .................. 361/703 |
| 6,830,960 B1 | * | 12/2004 | Alcoe et al. ................ 438/122 |
| 6,896,045 B1 | * | 5/2005 | Panek ......................... 165/185 |
| 6,898,084 B1 | * | 5/2005 | Misra ......................... 361/710 |

FOREIGN PATENT DOCUMENTS

| | | |
|---|---|---|
| JP | 2000012749 A | 1/2000 |
| SU | 488055 A1 | 10/1975 |

* cited by examiner

*Primary Examiner*—Boris Chervinsky
(74) *Attorney, Agent, or Firm*—Lily Neff, Esq.; Kevin P. Radigan, Esq.; Heslin Rothenberg Farley & Mesiti, P.C.

(57) ABSTRACT

A thermal dissipation structure and method are provided which include a heat sink having a surface configured to couple to a surface of an electronic component for facilitating removal of heat from the component. The heat sink surface and the electronic component surface comprise dissimilar materials with different coefficients of thermal expansion. The heat sink surface has a pattern of channels therein which define multiple heat sink substructures. Each heat sink substructure includes a portion of the heat sink surface. The portions of the heat sink surface are coplanar and provide a reduced distance to neutral point across the heat sink surface. When the portions of the heat sink surface are bonded to the electronic component surface, shear stress within the bond is reduced.

27 Claims, 4 Drawing Sheets

THERMAL DISSIPATION STRUCTURE AND METHOD EMPLOYING SEGMENTED HEAT SINK SURFACE COUPLING TO AN ELECTRONIC COMPONENT

TECHNICAL FIELD

The present invention is directed to thermal dissipation structures and methods for removing heat from electronic components. More particularly, the present invention is directed to a thermal dissipation structure and method with enhanced bonding between a heat sink of the thermal dissipation structure and an electronic component, wherein the bonding surfaces of the heat sink and electronic component comprise dissimilar materials with different coefficients of thermal expansion.

BACKGROUND OF THE INVENTION

As an electronic component operates, heat is generated which must be removed or dissipated. Typically, heat is dissipated by a cooling structure, such as an aluminum (Al) or copper (Cu) heat sink coupled to the electronic component. The heat sink absorbs heat from the electronic component, and dissipates the heat via direct air convection. Heat sinks are well known in the electronics industry and are used extensively to dissipate heat generated by electronic components used in computers and various other electronic equipment.

Improvements in integrated circuit (IC) design and fabrication allow IC manufacturers to produce ever smaller and lighter weight IC devices and other electronic components which require cooling.

For lighter weight electronic components, graphite composite (e.g., graphite/epoxy) heat sinks offer advantage over conventional aluminum or copper heat sinks in that their thermal performance is nearly that of aluminum and copper heat sinks, but at a fraction of the weight and cost. One example of a graphite composite heat sink is described in commonly assigned, U.S. Pat. No. 6,684,501, entitled "Foil Heat Sink and A Method for Fabricating Same", which is hereby incorporated herein by reference in its entirety.

SUMMARY OF THE INVENTION

Applicants have discovered that problems arise when attempts are made to attach a graphite composite heat sink to, for example, a module cap or thermal spreader of an electronic component comprising a dissimilar material (e.g., a metal cap or spreader). Because of an inherent coefficient of thermal expansion (CTE) mismatch between, for example, a graphite composite heat sink and a typical module cap or thermal spreader of an electronic component, and because of a relatively large distance to neutral point (DNP) of today's heat sinks, use of solder or an epoxy bonding attach material can be difficult (e.g., when DNP becomes greater than 40 mm). This is because too much strain would be put on the bonded interface due to the CTE mismatch and the relatively large DNP, resulting in interface fracturing.

Therefore, a need exists for an enhanced thermal dissipation structure and method which allow a heat sink and electronic component of dissimilar materials with different coefficients of thermal expansion to be bonded together using an epoxy based or solder based attach material by reducing shear stresses within the bond.

The needs of the art are addressed, and additional advantages are provided, by the present invention which in one aspect is a thermal dissipation structure which includes a heat sink having a first surface configured to couple to a second surface of an electronic component for facilitating removal of heat from the electronic component. The first surface of the heat sink and the second surface of the electronic component are assumed to comprise dissimilar materials with different coefficients of thermal expansion. In accordance with an aspect of the invention, the first surface of the heat sink has a pattern of channels therein. The pattern of channels define multiple heat sink substructures. Each heat sink substructure includes a portion of the first surface of the heat sink, with the portions of the first surface of the heat sink substructures being coplanar and providing a reduced distance to neutral point across the first surface of the heat sink so that when the portions of the first surface of the heat sink are bonded to the second surface of the electronic component, shear stress within the bond is reduced.

In another aspect, an electronic assembly is provided comprising an electronic component and a thermal dissipation structure. The thermal dissipation structure includes a heat sink having a first surface configured to couple to a second surface of the electronic component for facilitating removal of heat from the electronic component. The first surface of the heat sink and the second surface of the electronic component comprise dissimilar materials with different coefficients of thermal expansion. The first surface of the heat sink includes a pattern of channels therein. The pattern of channels define multiple heat sink substructures, with each heat sink substructure including a portion of the first surface of the heat sink. The portions of the first surface of the heat sink substructures are coplanar and provide a reduced distance to neutral point across the first surface of the heat sink. The electronic assembly further includes a bonding material disposed between the portions of the first surface of the heat sink substructures and the second surface of the electronic component, wherein the bonding material comprises a thermal interface between the portions of the first surface of the heat sink of the multiple heat sink substructures and the second surface of the electronic component.

In another aspect, a thermal dissipation method for an electronic component is provided. The method included: providing a heat sink having a first surface configured to couple to a second surface of the electronic component for facilitating removal of heat from the electronic component, wherein the first surface of the heat sink and the second surface of the electronic component comprise dissimilar materials with different coefficients of thermal expansion, and wherein the first surface of the heat sink has a pattern of channels therein, the pattern of channels defining multiple heat sink substructures, each heat sink substructure including a portion of the first surface of the heat sink, the portions of the first surface of the heat sink substructures being coplanar, and providing a reduced distance to neutral point across the first surface of the heat sink; bonding the portions of the first surface of the heat sink substructures to the second surface of the electronic component, wherein the portions of the first surface of the heat sink of the multiple heat sink substructures with the reduced distance to neutral point result in shear stress within the bond between the first surface of the heat sink and the second surface of the electronic component being reduced.

Further, additional features and advantages are realized through the techniques of the present invention. Other embodiments and aspects of the invention are described in detail herein and are considered a part of the claimed invention.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

BEST MODE FOR CARRYING OUT THE INVENTION

As used herein, "electronic component" comprises any heat generating component of, for example, a computer system or other electronics system requiring cooling. The term includes one or more integrated circuit devices, electronic devices, or electronic modules, either with or without a thermal cap or thermal spreader.

Figure 1:
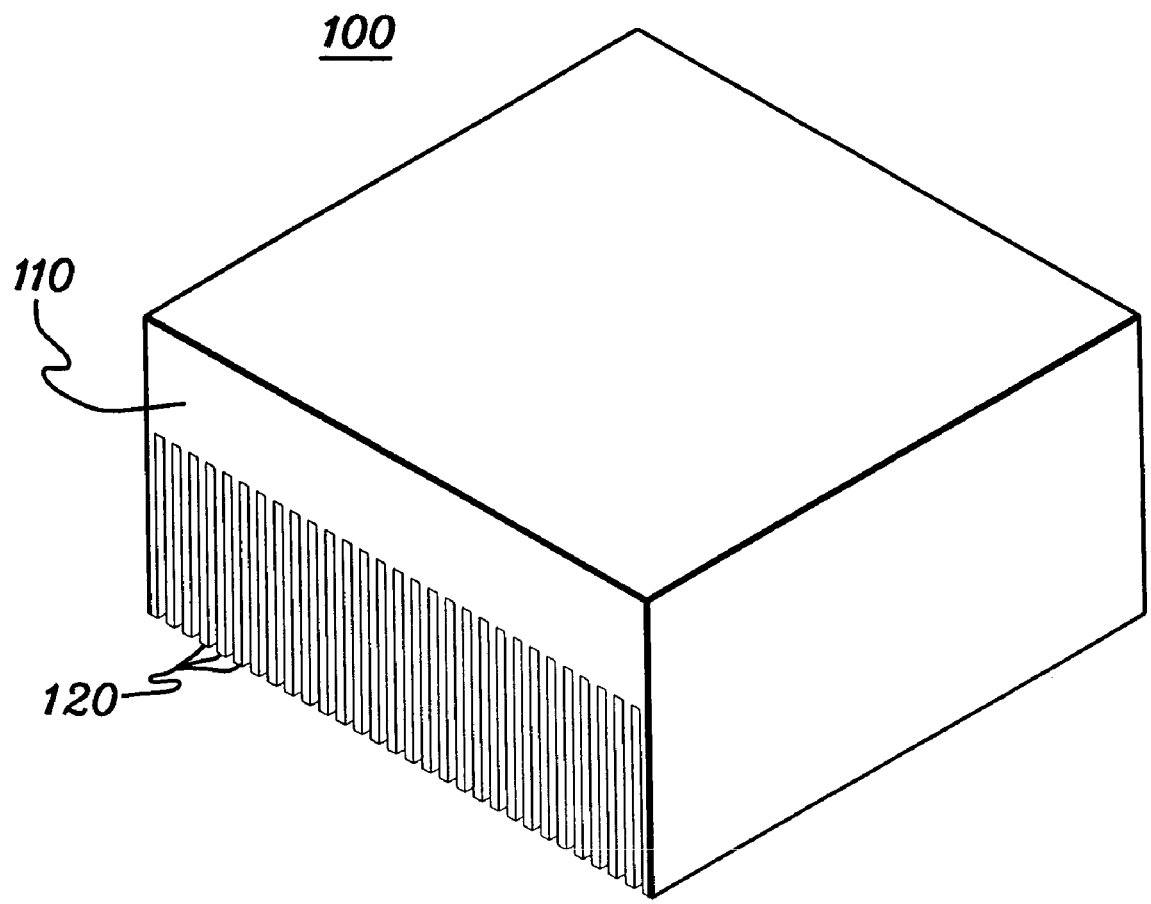
FIG. 1 depicts one embodiment of a conventional aluminum (Al) or copper (Cu) heat sink having a plurality of fin plates extending from one main surface of a base of the heat sink.

FIG. 1 depicts one embodiment of a conventional heat sink, generally denoted 100, for use with an electronic component. In this example, heat sink 100 is a monolithic structure which includes a base 110 from which a plurality of fin plates 120 extend to facilitate heat transfer from the heat sink to the surrounding environment. Typically heat sink 100 is made of aluminum (Al) or copper (Cu), both of which closely match the coefficient of thermal expansion of the electronic component surface to which the heat sink is to be attached (which is assumed to also comprise a metal).

Figure 2:
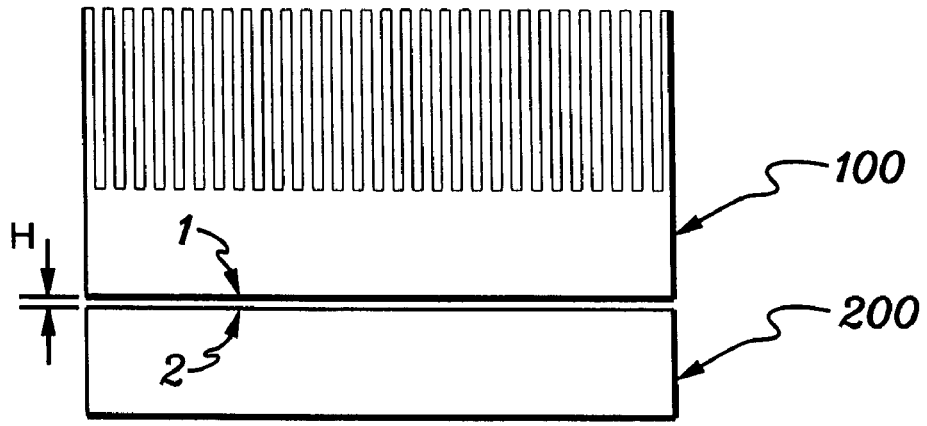
FIG. 2 is a side-elevational view of one embodiment of a conventional heat sink and electronic component bonded together.

As noted, certain advantages can be realized by transitioning the heat sink material to, for example, a graphite composite material. The disadvantage of this transition, however, is that a coefficient of thermal expansion mismatch results between the heat sink and the electronic component to which the heat sink is to be coupled. FIG. 2 depicts one example of a heat sink 100 residing atop an electronic component 200. Heat sink 100 has a first planar surface 1 and electronic component 200 has a second planar surface 2 which are to be bonded. When bonding material is employed, the bonding material resides between surfaces 1 & 2 and separates the surfaces by a distance H.

Figure 3:
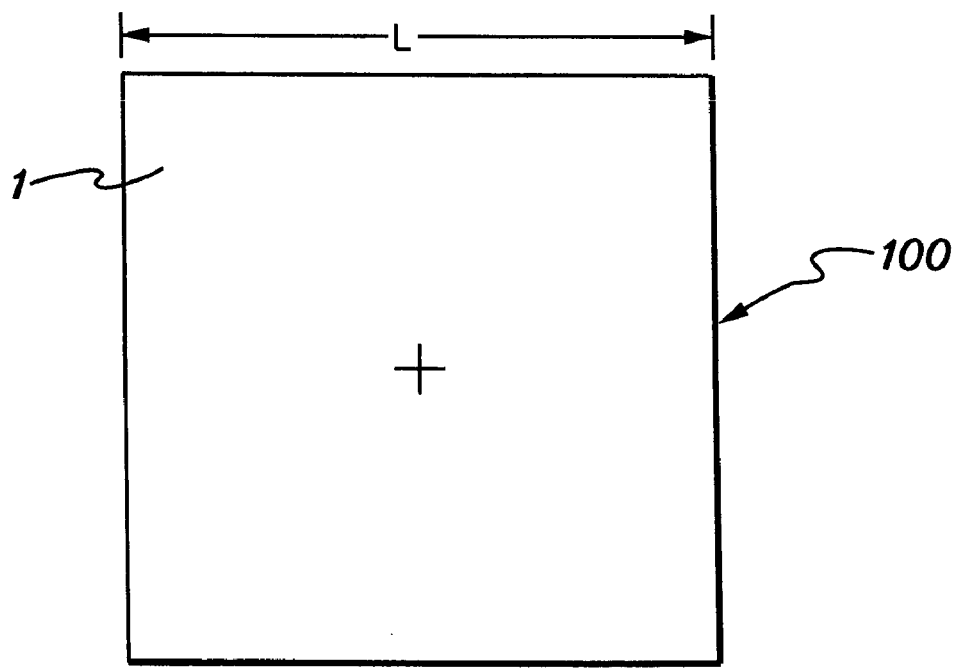
FIG. 3 depicts a plan view of a first surface of the heat sink of FIG. 2, shown bonded to a second surface of the electronic component in FIG. 2.

FIG. 3 is a plan view of surface 1 of heat sink 100, showing (in this example) the surface to have a square shaped area of length L on a side. With this configuration, the shear strain on the bond formed between the planar surfaces of heat sink 100 and electronic component 200 (see FIG. 2) can be expressed as equation (1):

$$C = \frac{DNP}{H}[a_1(T_1 - T_0) - a_2(T_2 - T_0)] \quad (1)$$

Where:
c=joint shear strain
DNP=distance from neutral point
H=joint thickness
$a_1$=coefficient of thermal expansion of first material
$a_2$=coefficient of thermal expansion of second material
$T_0$=reference temperature (0 strain)
$T_1$=temperature of the first surface
$T_2$=temperature of the second surface.

The strain neutral point for a bond such as depicted in FIG. 2 is the center of, for example, surface 1 shown in FIG. 3. The strain on the bond between surface 1 and surface 2 is directly proportional to the distance from the neutral point (DNP) on the respective surface, with the highest strain occurring at the points farthest from the neutral point. Thus, with a square shaped area, it can be shown that the maximum shear strain occurs at the corners, where the DNP=0.707L. This formula applies for most heat sinks, which typically have a rectangular shaped surface area (or a square shaped surface area) for the surface being bonded to the electronic component. As the coefficient of thermal expansion (CTE) mismatch increases between the surfaces of dissimilar materials being bonded, the joint shear strain increases proportionally. Further, equation (1) establishes that as the distance to neutral point increases, the shear strain on the bond between two surfaces increases. Thus, if the distance to neutral point is reduced, then shear strain in a joint due to CTE mismatch can also be reduced. As used herein, the phrase "dissimilar materials" means that the material comprising the heat sink first surface and the material comprising the electronic component second surface are structurally and/or chemically distinct, with a CTE mismatch of 1.5× $10^{-5}$ m/m·K or greater.

Figure 4:
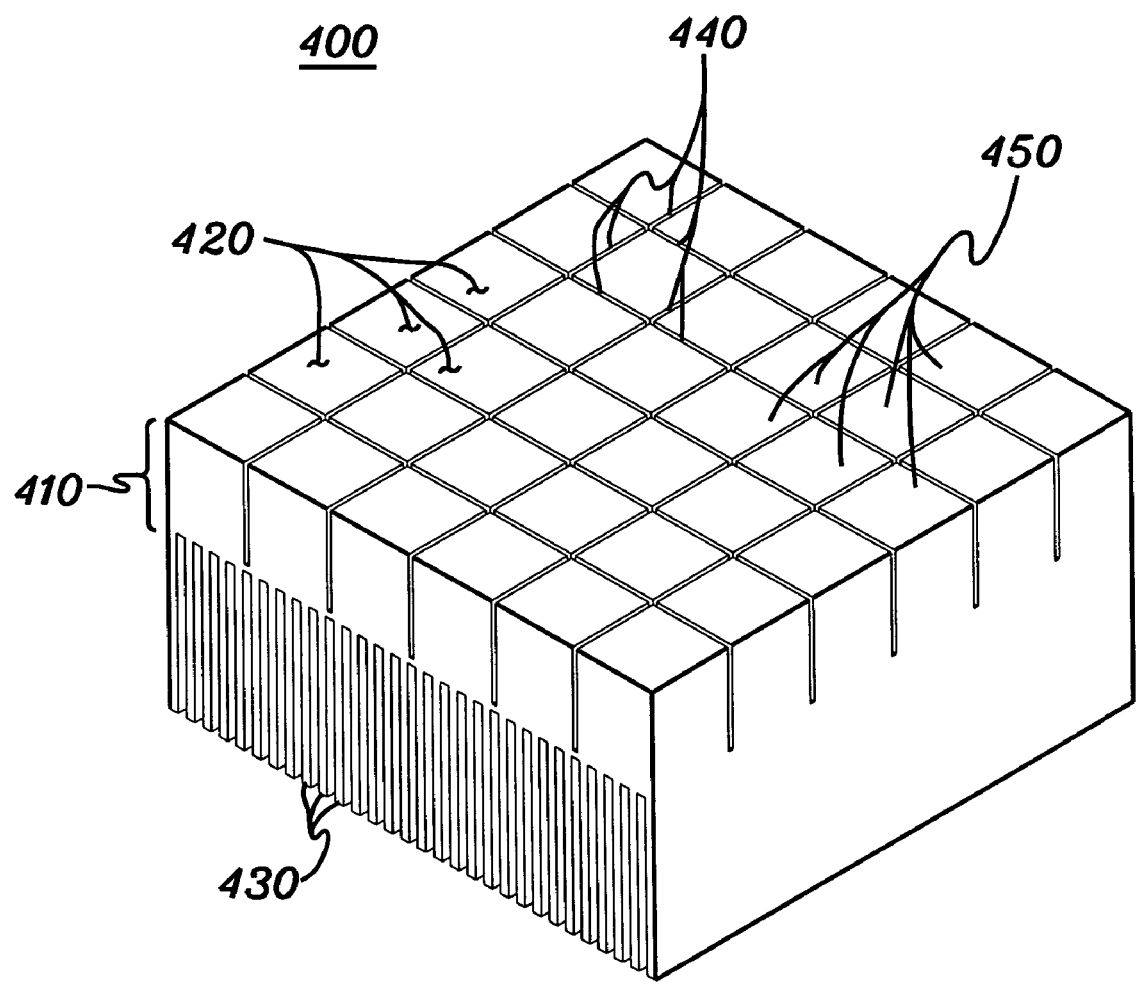
FIG. 4 depicts one embodiment of a thermal dissipation structure, in accordance with an aspect of the present invention.

FIG. 4 depicts one embodiment of a heat sink, denoted 400, in accordance with an aspect of the present invention. Heat sink 400 includes a base 410 and a first surface 420, which comprises one main surface of the heat sink base 410. Another main surface of heat sink base 410 has a plurality of plate fins 430 extending therefrom. In one embodiment, heat sink 400 can comprise a monolithic structure fabricated of a graphite composite material in a manner described in the above-incorporated U.S. Pat. No. 6,684,501.

As shown in FIG. 4, heat sink base 410 is mechanically segmented by a pattern of grooves 440 in the heat sink base extending from first surface 420 into the base of the heat sink. In the embodiment shown, grooves are cut into the heat sink base in orthogonal directions to create segmented base regions, which are referred to herein as heat sink substructures 450. Each heat sink substructure 450 includes a portion of the first surface 420 of heat sink 400, and these portions of the first surface are coplanar as shown. The depth of the pattern of grooves in the base of the heat sink is, in one embodiment, nearly equal to the depth of the heat sink base itself. For example, if the heat sink base is 15 mm thick from the first surface 420 to the surface from which the finned plates 430 project, then the pattern of grooves might be 13–14 mm deep. However, the depth of the grooves depends, in part, upon the thickness of the heat sink base. If the heat sink base is thicker, then the depth of the grooves need not nearly equal the thickness of the heat sink base. For example, with a heat sink base of 20 mm thick, the grooves might still be 13–14 mm deep and achieve the compliance desired between the heat sink substructures 450. Typically, the depth of the grooves will be greater than one half the thickness of the heat sink base. The width of each groove might be 1 mm or less, depending upon the method used to form the grooves. Standard machine saw cutting (radial, band, gang, etc.) can readily be employed with a graphite composite heat sink material. The result is multiple heat sink substructures or base regions that behave substantially independently with respect to CTE mismatch strain, since each region has a significantly lower distance to neutral point (DNP).

For example, with a pattern of grooves as shown in FIG. 4, and a 113 mm by 113 mm surface area for first surface 420 of the heat sink, the first surface is segmented into 36 subregions each approximately 18 mm by 18 mm. The strain that will still occur over the combined portions of the first surface will be taken up by compliance in the web of the heat sink base that remains. In fact, one or more heat sink substructures could fracture with little thermal impact to the overall performance of the heat sink, since the heat flow under these circumstances is nearly one dimensional. By substantially decreasing the distance to neutral point across the first surface of the heat sink, the resultant strain when the first surface is bonded to, for example, a thermal cap or thermal spreader of an electronic component is substantially decreased. This is true notwithstanding that there is a CTE mismatch between the dissimilar materials of the heat sink and the thermal cap or thermal spreader of the electronic component to which the surface is soldered or epoxied.

Figure 5:
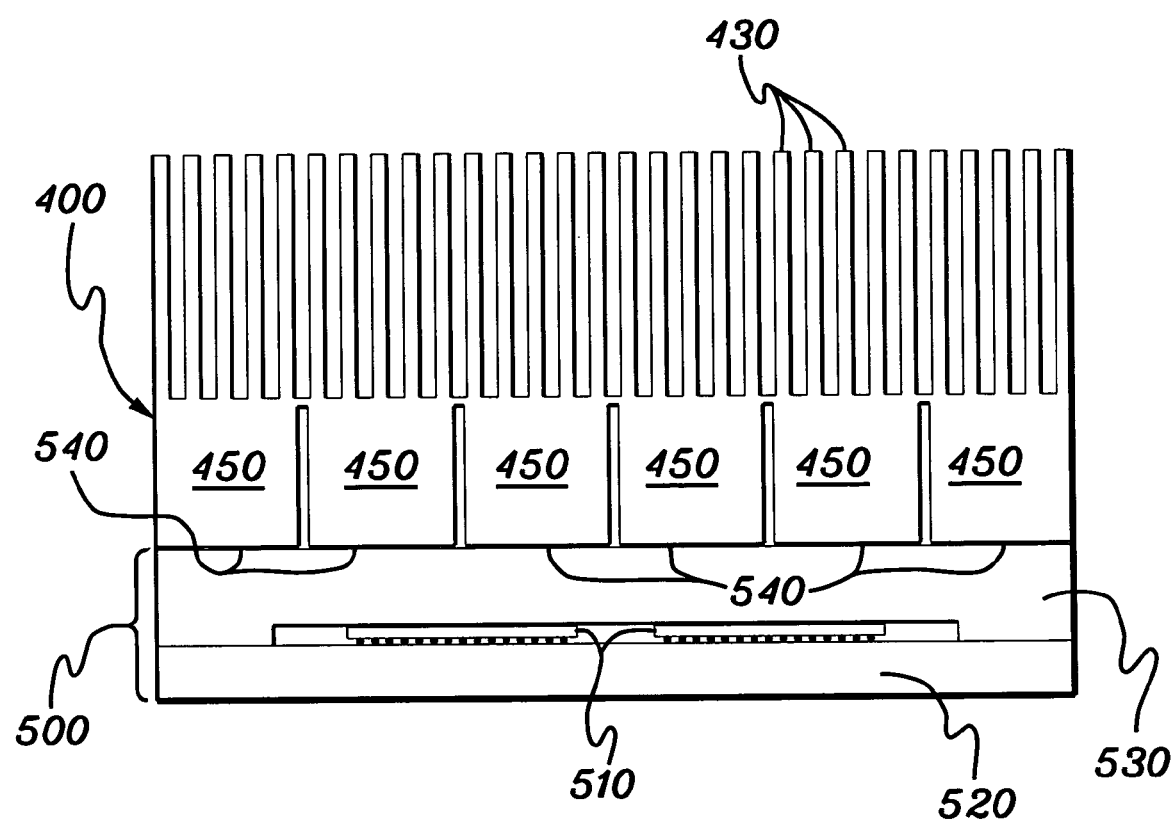
FIG. 5 is a cross-sectional, elevational view of an electronic assembly comprising an electronic module and a thermal dissipation structure such as depicted in FIG. 4, in accordance with an aspect of the present invention.

FIG. 5 depicts one embodiment of heat sink 400 bonded to an electronic component 500. Heat sink 400 includes a plurality of plate fins 430. In this example, electronic component 500 comprises an electronic module having multiple integrated circuit chips 510 disposed on a substrate 520 over which there is a thermal cap 530. Bonding of heat sink 400 to electronic component 500 is achieved between the portions of the first surface 420 (FIG. 4) of the heat sink remaining with the heat sink substructures 450 and the top surface of the thermal cap 530 of the electronic component 500. The bonding material 540 can comprise any joint material which provides a good thermal interface between the surfaces of the heat sink and electronic component. Solder based and epoxy based materials are two examples. If a solder joint is formed, and the heat sink comprises a graphite composite material, then the first surface 420 (FIG. 4) of the heat sink can be metalized so that the heat sink can be soldered to a thermal cap or thermal spreader (which is assumed to comprise metal). No special surface treatment is required for an epoxy based joint or interface between the heat sink and electronic component.

Those skilled in the art will note from the above discussion that other heat sink embodiments are possible without departing from the present invention. For example, in an alternate embodiment, the heat sink substructures could be separately manufactured and then assembled onto a heat sink base, or even bonded directly to a thermal cap or thermal spreader of an electronic component such that the resultant structure would resemble that of a monolithic heat sink. Machining the base as shown in FIG. 4 advantageously makes for easier handling of the heat sink subsections, but is not necessarily required. In a still further embodiment, the heat sink subsections could be bonded to a one main surface of a heat sink base, having for example, a plurality of finned plates extending from another main surface thereof, and the heat sink base could then be bonded to an electronic component.

Although preferred embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

What is claimed is:

1. A thermal dissipation structure comprising:
a heat sink having a first surface configured to couple to a second surface of an electronic component for facilitating removal of heat from the electronic component, wherein the first surface of the heat sink and the second surface of the electronic component comprise dissimilar materials with different coefficients of thermal expansion; and
wherein the first surface of the heat sink has a pattern of open channels therein, the channels of the pattern of open channels extending into the heat sink a distance less than a thickness of the heat sink, and the pattern of open channels defining multiple heat sink substructures, each heat sink substructure including a portion of the first surface of the heat sink, the portions of the first surface of the heat sink substructures being coplanar, and providing a reduced distance to neutral point across the first surface of the heat sink so that when the portions of the first surface of the heat sink are bonded to the second surface of the electronic component shear stress within the bond is reduced.

2. The thermal dissipation structure of claim 1, wherein the multiple heat sink substructures are partially compliant, the partial compliance enhancing coupling of the heat sink to the electronic component when the portions of the first surface of the heat sink are bonded to the second surface of the electronic component.

3. The thermal dissipation structure of claim 1, wherein the heat sink comprises a graphite composite material, and wherein the electronic component comprises at least one of an electronic device, an electronic module, an integrated circuit chip and a thermal spreader.

4. The thermal dissipation structure of claim 1, wherein the heat sink comprises a heat sink base, and wherein the first surface comprises one main surface of the heat sink base, and wherein the heat sink base further includes another main surface with a plurality of fins projecting therefrom.

5. The thermal dissipation structure of claim 4, wherein the pattern of open channels in the first surface of the heat sink comprises a pattern of grooves in the heat sink base at the first surface of the heat sink, the pattern of grooves extending from the one main surface of the heat sink base towards the another main surface of the heat sink base with the plurality of fins projecting therefrom, the pattern of grooves extending from the one main surface a depth short of the another main surface.

6. The thermal dissipation structure of claim 5, wherein the grooves of the pattern of grooves extend into the heat sink base a distance greater than half the distance between the one main surface of the heat sink base and the another main surface of the heat sink base.

7. The thermal dissipation structure of claim 5, wherein the pattern of grooves comprises a grid pattern of grooves in the heat sink base, the grid pattern of grooves defining the multiple heat sink substructures, each heat sink substructure having a portion of the first surface of the heat sink with at least one of a rectangular shaped area or a square shaped area.

8. The thermal dissipation structure of claim 7, wherein the heat sink comprises a monolithic structure.

9. The thermal dissipation structure of claim 1, wherein the heat sink comprises a heat sink base, and the heat sink substructures are bonded to the heat sink base at one main surface of the heat sink base, and wherein the heat sink further comprises a plurality of fins projecting from the heat sink base at another main surface thereof.

10. An electronic assembly comprising:
an electronic component;
a thermal dissipation structure comprising:
a heat sink having a first surface configured to couple to a second surface of the electronic component for facilitating removal of heat from the electronic component, wherein the first surface of the heat sink and the second surface of the electronic component comprise dissimilar materials with different coefficients of thermal expansion; and
wherein the first surface of the heat sink has a pattern of open channels therein, the channels of the pattern of open channels extending into the heat sink a distance less than a thickness of the heat sink, and the pattern of open channels defining multiple heat sink substructures, each heat sink substructure including a portion of the first surface of the heat sink, the portions of the first surface of the heat sink substructures being coplanar, and providing a reduced distance to neutral point across the first surface of the heat sink; and
bonding material disposed between the portions of the first surface of the heat sink substructures and the second surface of the electronic component, wherein the bonding material comprises a thermal interface between the portions of the first surface of the heat sink substructures and the second surface of the electronic component.

11. The electronic assembly of claim 10, wherein the bonding material comprises one of a solder based material or an epoxy based material disposed between the portions of the first surface of the heat sink substructures and the second surface of the electronic component.

12. The electronic assembly of claim 10, wherein the multiple heat sink substructures are partially compliant, the partial compliance enhancing coupling strength of the heat sink to the electronic component.

13. The electronic assembly of claim 10, wherein the heat sink comprises a graphite composite material, and wherein the electronic component composes at least one of an electronic device, an electronic module, an integrated circuit chip, and a thermal spreader.

14. The electronic assembly of claim 10, wherein the heat sink comprises a heat sink base, and wherein the first surface comprises one main surface of the heat sink base, and wherein the heat sink base further includes another main surface with a plurality of fins projecting therefrom.

15. The electronic assembly of claim 14, wherein the pattern of open channels in the first main surface of the heat sink comprises a pattern of grooves in the heat sink base at the first surface of the heat sink, the pattern of grooves extending from the one main surface of the heat sink base comprising the first surface towards the another main surface of the heat sink base with the plurality of fins projecting therefrom, the pattern of grooves extending from the one main surface a depth short of the another main surface.

16. The electronic assembly of claim 15, wherein the grooves of the pattern of grooves extend into the heat sink base a distance greater than half the distance between the one main surface of the heat sink base and the another main surface of the heat sink base.

17. The electronic assembly of claim 15, wherein the pattern of grooves comprises a grid pattern of grooves in the heat sink base, the grid pattern of grooves defining the multiple heat sink substructures, each heat sink substructure having a portion of the first surface of the heat sink with at least one of a rectangular shaped area or a square shaped area.

18. The electronic assembly of claim 17, wherein the heat sink comprises a monolithic, graphite composite structure.

19. The electronic assembly of claim 10, wherein the heat sink comprises a heat sink base, and the heat sink substructures are bonded to the heat sink base at one main surface of the heat sink base, and wherein the heat sink further comprises a plurality of fins projecting from the heat sink base at another main surface thereof.

20. A thermal dissipation method for an electronic component, said method comprising:
providing a heat sink having a first surface configured to couple to a second surface of the electronic component for facilitating removal of heat from the electronic component, wherein the first surface of the heat sink and the second surface of the electronic component comprise dissimilar materials with different coefficients of thermal expansion;
wherein the first surface of the heat sink has a pattern of open channels therein, the channels of the pattern of open channels extending into the heat sink a distance less than a thickness of the heat sink, and the pattern of open channels defining multiple heat sink substructures, each heat sink substructure including a portion of the first surface of the heat sink, the portions of the first surface of the heat sink substructures being coplanar, and providing a reduced distance to neutral point across the first surface of the heat sink; and
bonding the portions of the first surface of the heat sink substructures to the second surface of the electronic component, wherein the portions of the first surface of the heat sink of the multiple heat sink substructures with the reduced distance to neutral point result in reduced shear stresses within the bond between the first surface of the heat sink and the second surface of the electronic component.

21. The method of claim 20, wherein the bonding comprises providing a bonding material between the portions of the first surface of the heat sink of the multiple heat sink substructures and the second surface of the electronic component comprising at least one of a solder based material or an epoxy based material.

22. The method of claim 20, wherein the providing of the heat sink further comprises mechanically segmenting the first surface of the heat sink to establish the pattern of open channels therein and define the multiple heat sink substructures.

23. The method of claim 22, wherein the mechanically segmenting comprises mechanically cutting grooves into the heat sink at the first surface thereof to define the pattern of channels in the first surface of the heat sink.

24. The method of claim 23, further comprising mechanically cutting grooves into the heat sink at the first surface thereof a sufficient depth that the multiple heat sink substructures are partially compliant.

25. The method of claim 20, wherein the heat sink further comprises a heat sink base, the first surface of the heat sink comprises one main surface of the heat sink base, and the grooves of the pattern of grooves extend into the heat sink base a distance X, and wherein the heat sink base has a thickness Y between the one main surface thereof and another main surface of the heat sink base, with $X > \frac{1}{2}Y$ and $X < Y$.

26. The method of claim 20, wherein the heat sink comprises a monolithic, graphite composite material, and wherein the electronic component comprises at least one of an electronic device, an electronic module, an integrated circuit chip and a thermal spreader.

27. The method of claim 20, wherein the heat sink comprises a heat sink base, and wherein the providing of the heat sink comprises bonding heat sink substructures to the heat sink base at one main surface of the heat sink base, the bonded heat sink substructures being in spaced relation, thereby establishing the pattern of open channels at the first surface of the heat sink.

* * * * *